United States Patent
Tajima et al.

(10) Patent No.: US 9,871,197 B2
(45) Date of Patent: Jan. 16, 2018

(54) SEMICONDUCTOR MEMORY DEVICE

(71) Applicant: Toshiba Memory Corporation, Minato-ku (JP)

(72) Inventors: Hikari Tajima, Mitaka (JP); Takashi Izumida, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 35 days.

(21) Appl. No.: 15/003,888

(22) Filed: Jan. 22, 2016

(65) Prior Publication Data
US 2017/0098763 A1  Apr. 6, 2017

Related U.S. Application Data

(60) Provisional application No. 62/237,117, filed on Oct. 5, 2015.

(51) Int. Cl.
  *H01L 27/32* (2006.01)
  *H01L 45/00* (2006.01)
  *H01L 27/24* (2006.01)

(52) U.S. Cl.
  CPC ........ *H01L 45/146* (2013.01); *H01L 27/2454* (2013.01); *H01L 27/2481* (2013.01); *H01L 45/04* (2013.01); *H01L 45/1226* (2013.01)

(58) Field of Classification Search
  None
  See application file for complete search history.

(56) References Cited

U.S. PATENT DOCUMENTS

| 7,800,091 | B2 | 9/2010 | Kamigaichi et al. |
| 8,299,571 | B2 | 10/2012 | Ozawa et al. |
| 9,047,937 | B2* | 6/2015 | Kang ............. G11C 13/0007 |
| 9,099,648 | B2 | 8/2015 | Yamato et al. |
| 2010/0159675 | A1* | 6/2010 | Jeong ............. H01L 45/1273 438/482 |
| 2011/0127483 | A1* | 6/2011 | Sonehara ......... G11C 13/0002 257/2 |

(Continued)

FOREIGN PATENT DOCUMENTS

| JP | 2008-277543 | 11/2008 |
| JP | 2011-129639 | 6/2011 |
| JP | 2014-220482 | 11/2014 |

*Primary Examiner* — Michael Lebentritt
(74) *Attorney, Agent, or Firm* — Oblon, McClelland, Maier & Neustadt, L.L.P.

(57) ABSTRACT

A semiconductor memory device according to an embodiment includes: a plurality of first conductive lines stacked in a first direction above a semiconductor substrate and extending in a second direction; a second conductive line extending in the first direction; semiconductor layers arranged between the first conductive lines and the second conductive line and extending in the first direction; a conductive layer in contact with a bottom surface of the semiconductor layer with a first impurity of a first conductivity type; and variable resistance films arranged at intersections between the first conductive lines and the semiconductor layer, the semiconductor layer having a first semiconductor part arranged from the bottom surface of the semiconductor layer to a position equal to or lower than a bottom surface of the first conductive line at a lowermost layer in the first direction with a second impurity of a second conductivity type.

20 Claims, 10 Drawing Sheets

(56) References Cited

U.S. PATENT DOCUMENTS

| | | | |
|---|---|---|---|
| 2012/0008367 A1* | 1/2012 | Kajiyama | H01L 27/228 |
| | | | 365/148 |
| 2012/0264273 A1* | 10/2012 | Kang | H01L 45/06 |
| | | | 438/382 |
| 2013/0292630 A1* | 11/2013 | Sasago | H01L 27/2454 |
| | | | 257/4 |
| 2015/0255715 A1* | 9/2015 | Takagi | G11C 13/0011 |
| | | | 365/148 |
| 2016/0268339 A1* | 9/2016 | Sakuma | H01L 27/249 |
| 2017/0062523 A1* | 3/2017 | Sekino | H01L 27/249 |

\* cited by examiner

SEMICONDUCTOR MEMORY DEVICE

CROSS-REFERENCE TO RELATED APPLICATIONS

This application is based upon and claims the benefit of priority from the prior U.S. Provisional Application 62/237,117, filed on Oct. 5, 2015, the entire contents of which are incorporated herein by reference.

BACKGROUND

Field

An embodiment of the present invention relates to a semiconductor memory device.

Description of the Related Art

Recent years, large-scale integration (LSI) elements have been gradually miniaturized along increase in degree of integration of semiconductor memory devices. Not only simply narrowing a line width, but also improving dimensional accuracy and positional accuracy of a circuit pattern is also required for the miniaturization of the LSI element. A resistive RAM (ReRAM) in which a variable resistance element that variably changes a resistance value is used in a memory cell has been proposed as a technique of overcoming such a problem. Further, a ReRAM having a three-dimensional structure in which the variable resistance element is arranged at each intersection between a plurality of stacked word lines extending in parallel with a semiconductor substrate, and a bit line extending vertically to the semiconductor substrate has been proposed in order to achieve further increase in the degree of integration. Further, a technique to control leakage current during an access operation by performing on/off control of the bit line has been also proposed for the ReRAM having the three-dimensional structure.

DETAILED DESCRIPTION

A semiconductor memory device according to an embodiment includes: a plurality of first conductive lines which are stacked in a first direction above a semiconductor substrate and extend in a second direction horizontal to the semiconductor substrate; a second conductive line which extends in the first direction; a semiconductor layer which is arranged between each of the first conductive lines and the second conductive line and extends in the first direction; a conductive layer which is in contact with a bottom surface of the semiconductor layer and includes a first impurity of a first conductivity type; and a variable resistance film which is arranged between each of the first conductive lines and the semiconductor layer at each intersection between the first conductive lines and the semiconductor layer, the semiconductor layer having a first semiconductor part which is arranged from the bottom surface of the semiconductor layer to a position equal to or lower than a bottom surface of the first conductive line at a lowermost layer in the first direction and includes a second impurity of a second conductivity type different from the first conductivity type.

Hereinafter, a semiconductor memory device according to an embodiment will be described with reference to the drawings.

First, a description will be given regarding the entire configuration of the semiconductor memory device according to the embodiment.

Figure 1:
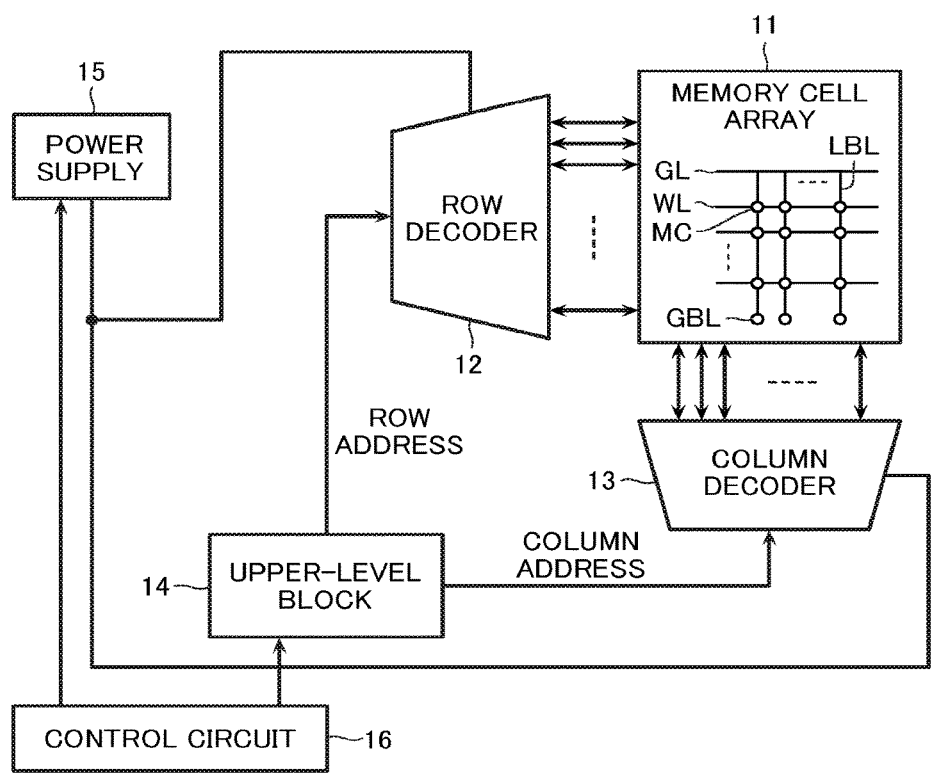
FIG. 1 is a functional block diagram of a semiconductor memory device according to an embodiment.

FIG. 1 is a functional block diagram of the semiconductor memory device according to the embodiment.

The semiconductor memory device according to the embodiment is provided with a memory cell array 11, a row decoder 12, a column decoder 13, an upper-level block 14, a power supply 15, and a control circuit 16.

The memory cell array 11 has a plurality of word lines WL and local bit lines LBL intersecting each other, and a memory cell MC arranged at each intersection thereof.

A lower end of the local bit line LBL is electrically connected to a global bit line GBL. The row decoder 12 selects the word line WL and the local bit line LBL during an access (erase/write/read) operation. The column decoder 13 selects the global bit line GBL during the access operation.

The upper-level block 14 selects the memory cell MC as an object to be accessed in the memory cell array 11. The upper-level block 14 imparts a row address and a column address to each of the row decoder 12 and the column decoder 13. The power supply 15 generates a predetermined voltage combination corresponding to each erase/write/read operation, and supplies the resultant to the row decoder 12 and the column decoder 13. The control circuit 16 transmits an address to the upper-level block 14 or controls the power supply 15 according to a command from outside.

Next, a description will be given regarding a circuit configuration of the memory cell array 11.

Figure 2:
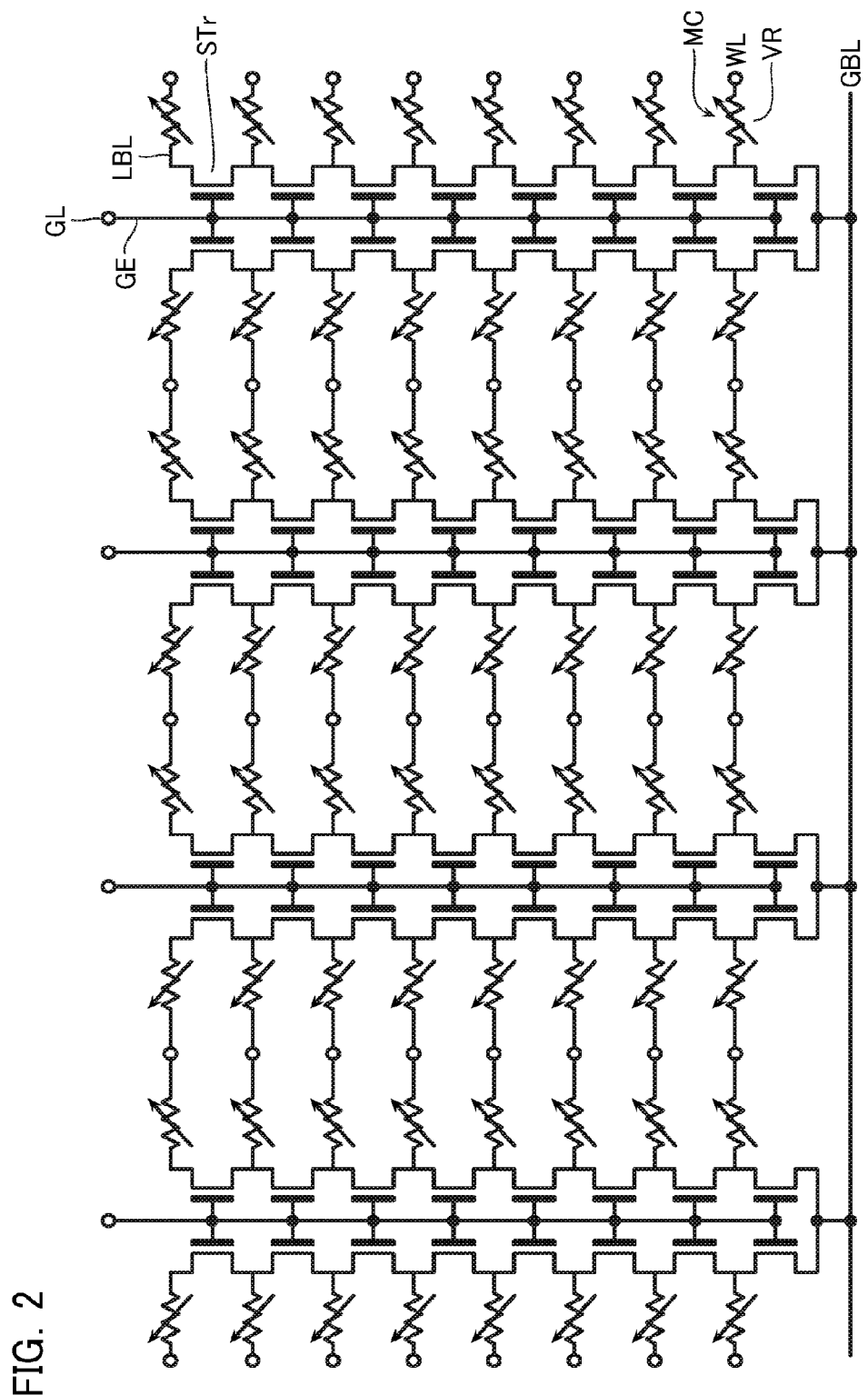
FIG. 2 is a circuit diagram of a memory cell array of the semiconductor memory device according to the embodiment.

FIG. 2 is a circuit diagram of the memory cell array of the semiconductor memory device according to the embodiment.

The memory cell array 11 has the word lines WL, the local bit lines LBL intersecting the word lines WL, the memory cells MC connected to the intersections between the word lines WL and the local bit lines LBL, and the global bit line GBL connected commonly to the lower ends of the local bit lines LBL. The single local bit line LBL has a plurality of selection transistors STr connected in series. Gate electrodes GE of the selection transistors STr are collectively controlled by a single gate line GL.

The memory cell MC has a variable resistance element VR. The variable resistance element VR can be electrically re-written and stores data in a non-volatile manner based on a resistance value. The variable resistance element VR represents a set operation and a reset operation when a certain level or higher voltage is applied to both ends thereof. The set operation is an operation in which the variable resistance element VR in a high-resistance state (reset state) is transitioned to a low-resistance state (set state). The reset operation is an operation in which the variable resistance element VR in the low-resistance state (set state) is transitioned to the high-resistance state (reset state). Incidentally, the variable resistance element VR also represents a forming operation other than the set operation and the reset operation. The variable resistance element VR immediately after being manufactured is in the high-resistance state in which a resistance state is not easily transitioned, but the forming operation is an operation in which a region (filament path) in which current easily flows is formed inside the variable resistance element VR when a voltage higher than those of the set operation and the reset operation is applied to both the ends of the variable resistance element VR. The variable resistance element VR becomes the state of being operable as a memory element via the forming operation.

Next, a description will be given regarding the access operation with respect to the memory cell MC.

In the case of accessing the single selected memory cell MC, the column decoder 12 first applies a predetermined voltage Vgbl to the global bit line GBL that corresponds to the selection memory cell MC, and at the same time, the row decoder 13 applies a predetermined voltage Vgl, different from the voltage Vgbl, to the gate line GL that corresponds to the selection memory cell MC. Then, an inversion layer is caused in the local bit line LBL that corresponds to the selection memory cell MC due to a potential difference between the voltage Vgbl and the voltage Vgl, and a channel (current path) is formed. As a result, the entire selection transistor STr of the local bit line LBL is turned on, and the local bit line LBL is selected. In this state, the row decoder 13 applies a predetermined selection voltage Vswl to the word line WL connected to the selection memory cell MC. Then, current flows in the selection memory cell MC due to a potential difference between the selected voltage Vswl of the word line WL and the voltage Vgbl of the global bit line GBL. Meanwhile, the row decoder 13 applies a non-selection voltage Vuwl at a level, which is smaller than the selection voltage Vswl and does not cause current to flow in the memory cell MC, to the word line WL connected to the non-selected memory cell MC. In this manner, the access with respect to the selection memory cell MC is realized.

Next, a description will be given regarding a structure of the memory cell array 11.

Figure 3:
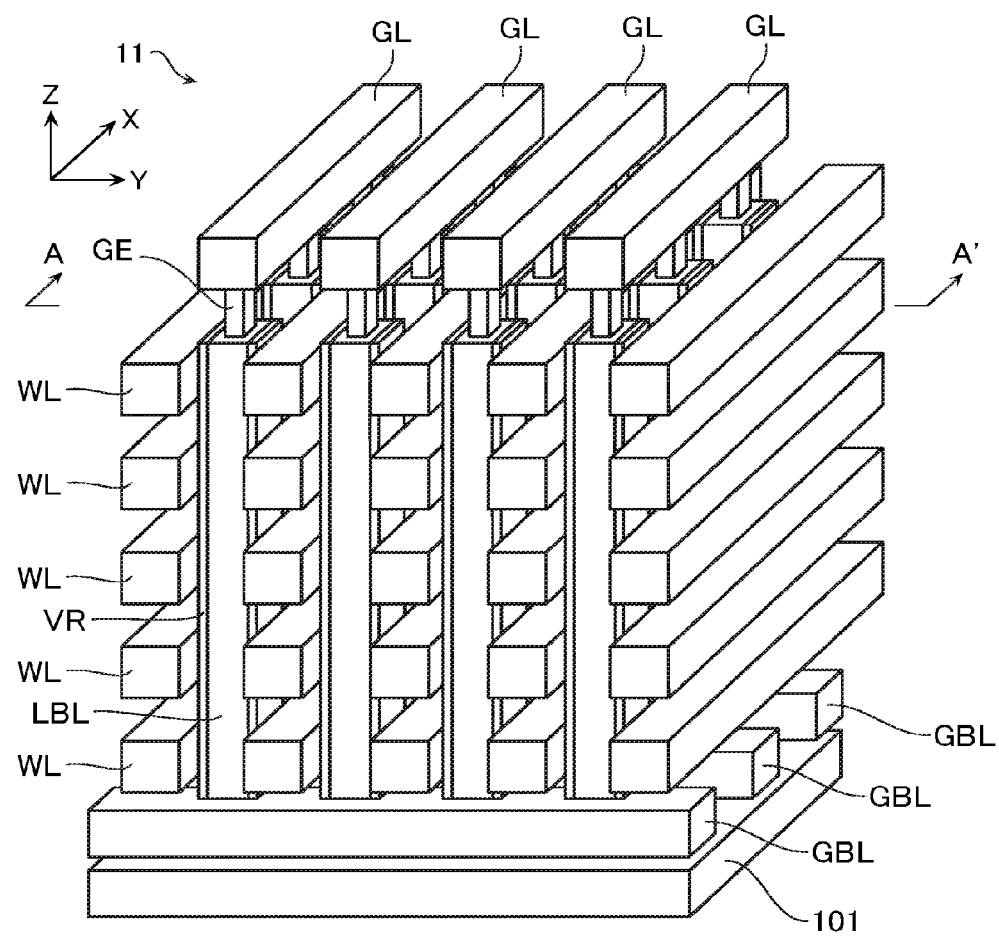
FIG. 3 is a perspective view illustrating a structure of the memory cell array of the semiconductor memory device according to the embodiment.
Figure 4:
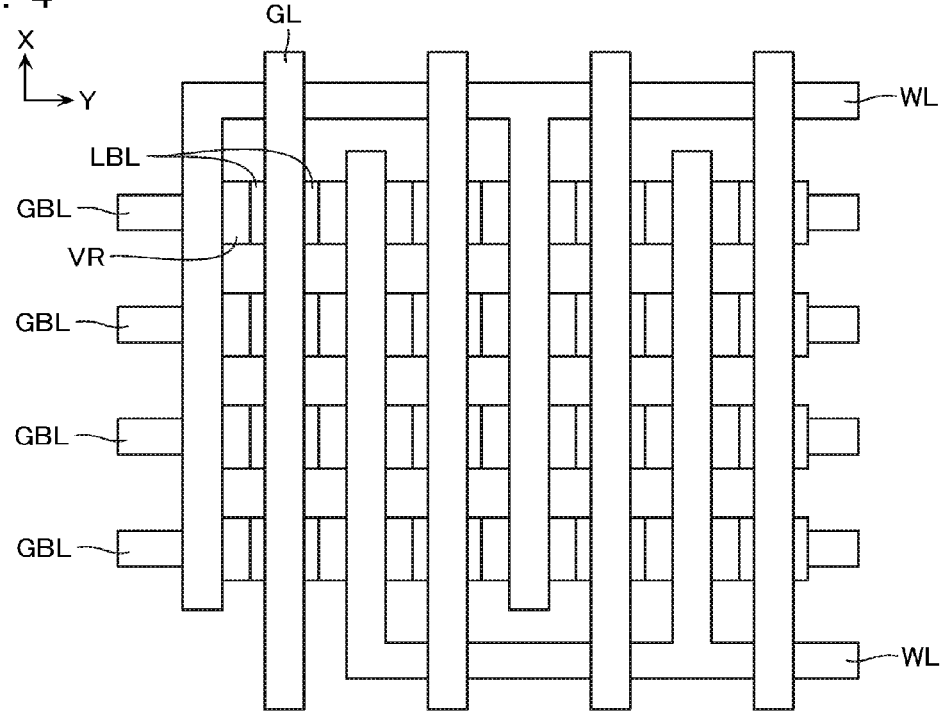
FIG. 4 is a plan view illustrating a structure of the memory cell array of the semiconductor memory device according to the embodiment.
Figure 5:
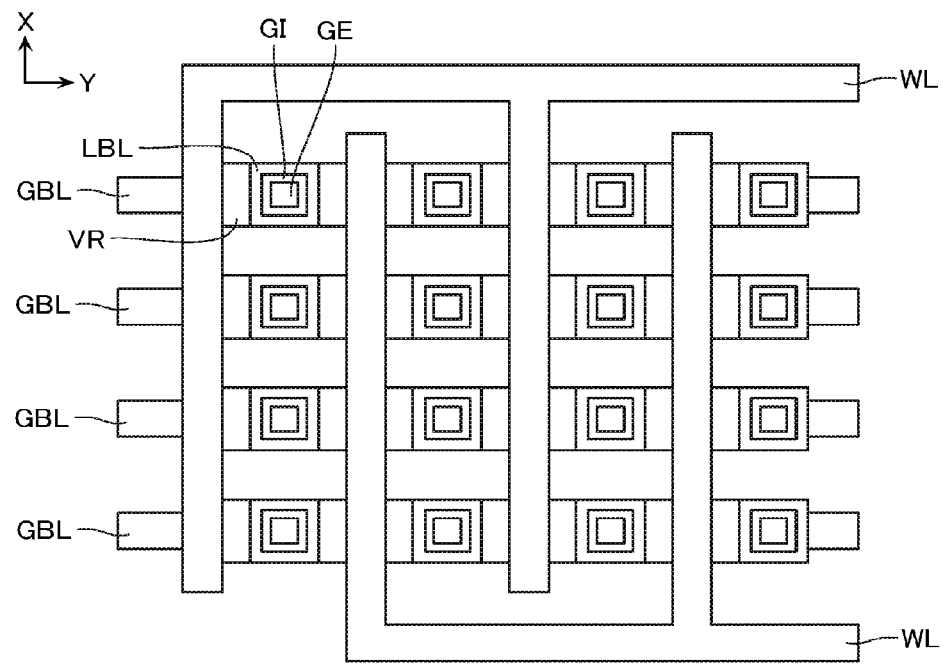
FIG. 5 is a cross-sectional view illustrating a structure of the memory cell array of the semiconductor memory device according to the embodiment.

FIG. 3 is a perspective view illustrating the structure of the memory cell array of the semiconductor memory device according to the embodiment. In addition, FIG. 4 is a plan view illustrating the structure of the same memory cell array, and FIG. 5 is a cross-sectional view illustrating the structure of the same memory cell array. FIG. 4 is the schematic plan view when an upper surface of the memory cell array 11 of FIG. 3 is viewed from a Z direction, and FIG. 5 is the cross-sectional view taken along line A-A' of FIG. 3. Hereinafter, three directions orthogonal to each other will be referred to as an "X direction", a "Y direction" and the "Z direction" in some cases.

The memory cell array 11 is arranged above a semiconductor substrate 101 which has a principal plane expanding in the X-Y directions as illustrated in FIG. 3.

The memory cell array 11 has the word lines WL which are stacked at a predetermined pitch in the Y direction and the Z direction above the semiconductor substrate 101. Each of the word lines WL is formed in a comb shape when viewed from the Z direction as illustrated in FIGS. 4 and 5.

The word line WL is made of for example, tungsten (W), tungsten nitride (WN), tungsten silicide (WSi$_x$), tantalum (Ta), tantalum nitride (TaN), tantalum silicide (TaSi$_x$), palladium silicide (PdSi$_x$), erbium silicide (ErSi$_x$), yttrium silicide (YSi$_x$), platinum silicide (PtSi$_x$), hafnium silicide (HfSi$_x$), nickel silicide (NiSi$_x$), cobalt silicide (CoSi$_x$), titanium silicide (TiSi$_x$), vanadium silicide (VSi$_x$), chromium silicide (CrSi$_x$), manganese silicide (MnSi$_x$), iron silicide (FeSi$_x$), ruthenium (Ru), molybdenum (Mo), titanium (Ti), vanadium (V), chromium (Cr), manganese (Mn), iron (Fe), cobalt (Co), nickel (Ni), gold (Au), silver (Ag), or copper (Cu) including polysilicon (Poly-Si) or a compound thereof. Further, the word line WL may be made of polysilicon (Poly-Si) added with an impurity, for example.

In addition, the memory cell array 11 has the variable resistance elements VR arranged in side surfaces in the Y direction of the respective word lines WL. The variable resistance element VR is made of a transition metal oxide such as chromium (Cr), tungsten (W), vanadium (V), niobium (Nb), tantalum (Ta), titanium (Ti), zirconium (Zr), scandium (Sc), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), tin (Sn), lead (Pb) or bismuth (Bi) including a metal oxide film such as hafnium oxide (HfO$_x$) or oxide such as a so-called rare earth element including lantern (La) to lutetium (Lu). A thickness of the variable resistance element VR is about, for example, 5 nm, but can be changed as appropriate within a range of about 2 to 10 nm. In addition, the variable resistance element VR may be formed to extend in the Z direction and be integrated over portions between the word lines WL as illustrated in FIG. 3, and may be formed independently for each of the word lines WL.

In addition, the memory cell array 11 has the local bit lines LBL each of which has a columnar shape extending in the Z direction and arranged on the side surface of the word line WL in the Y direction with the variable resistance element VR interposed therebetween. These local bit lines LBL are arranged in a matrix form in the X direction and the Y direction. Here, the local bit line LBL is formed using a semiconductor made of, for example, polysilicon (Poly-Si) or the like added with an impurity such as phosphorus (P), boron (B) or arsenic (As) including a semiconductor of polysilicon (Poly-Si) in which the impurity is not added.

Incidentally, although the local bit line LBL has a cross-section in the X-Y directions in a rectangular shape in the case of FIG. 5, a long-and-short relationship between a length in the X direction and a length in the Y direction of the cross-section is arbitrary. In addition, the cross-section in the X-Y directions of the local bit line LBL is not limited to the rectangular shape, but may have a circular shape and an elliptical shape.

In addition, the memory cell array 11 has the global bit lines GBL which extend in the Y direction and are electrically connected to the lower ends of the local bit lines LBL. The single global bit line GBL is commonly connected to the local bit lines LBL arranged side by side in the Y direction. Here, the global bit line GBL is made of metal, for example, tungsten (W) and the like.

In addition, the memory cell array 11 has the gate lines GL which extend in the X direction and are arranged above the word line WL as the uppermost layer. Here, the gate line GL is made of the same material as that of the word line WL.

In addition, the memory cell array 11 has the gate electrodes GE which are arranged inside the columnar-shape local bit lines LBL and extend in the Z direction. The gate electrodes GE arranged side by side in the Y direction are connected commonly to the single gate line GL. Each of the gate electrodes GE is arranged in the local bit line LBL with a gate insulating layer GI interposed therebetween. In other words, a side surface of the local bit line LBL and a side surface of the gate electrode GE oppose each other with the gate insulating layer GI interposed therebetween. Each upper end of the gate electrode GE is electrically connected to the gate line GL. Here, the gate electrode GE is made of, for example, n+ polysilicon (n+ Si) having a high impurity concentration or titanium nitride (TiN).

In a case in which the semiconductor memory device of the embodiment is configured as above, the memory cell MC including the variable resistance element VR is arranged with respect to each intersection between the word lines WL and the local bit lines LBL. In other words, the memory cells MC are arranged in a three-dimensional matrix form of being arranged respectively along the X direction, the Y direction and the Z direction.

Next, a description will be given regarding a stacked structure of a memory cell array according to a comparative example as a premise for describing a stacked structure of the memory cell array 11 of the embodiment.

Figure 6:
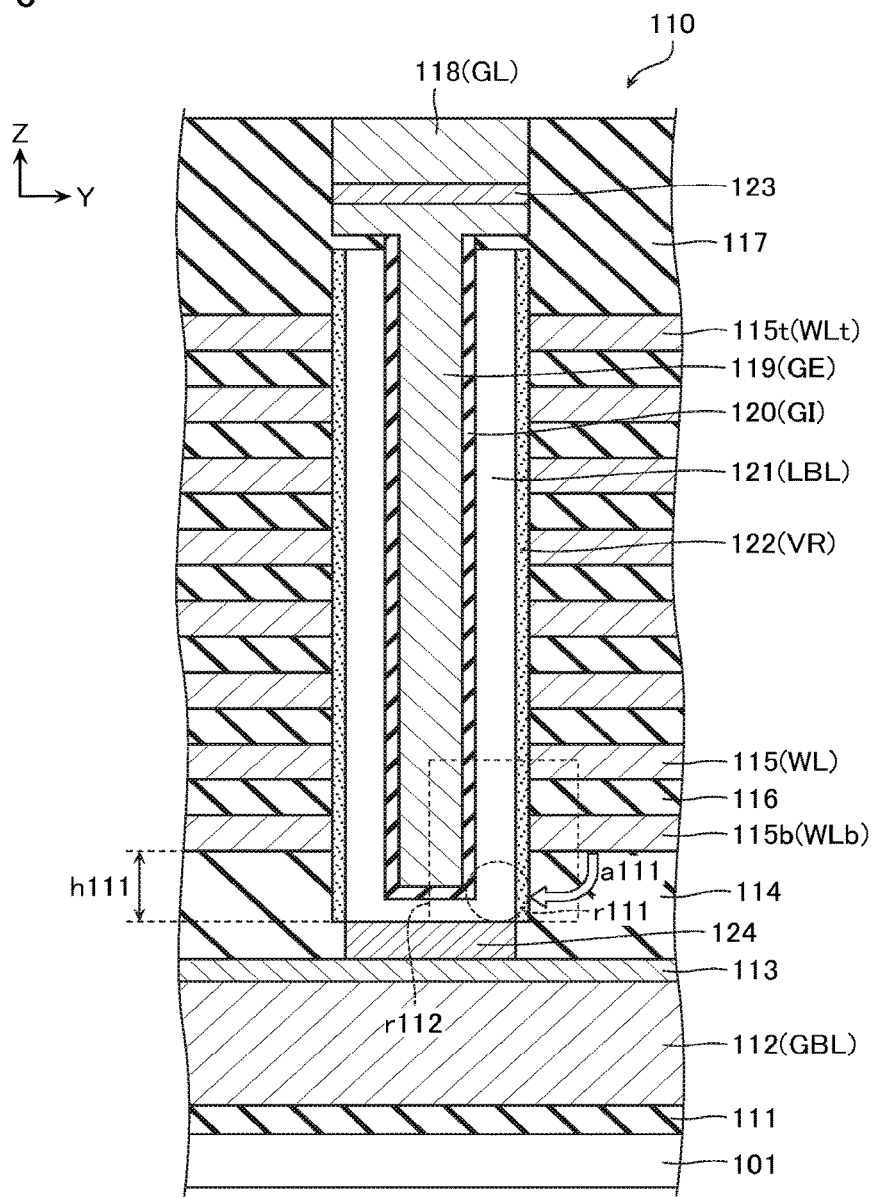
FIG. 6 is a cross-sectional view illustrating a stacked structure of a memory cell array of a semiconductor memory device according to a first comparative example with respect to the embodiment.

FIG. 6 is a cross-sectional view of the stacked structure of a memory cell array of a semiconductor memory device according to a first comparative example with respect to the embodiment. FIG. 6 is the cross-sectional view in the Y-Z directions.

A memory cell array 110 of the first comparative example has an interlayer insulating layer 111 stacked in the Z direction above the semiconductor substrate 101, a conductive line 112 extending in the Y direction and a barrier layer 113 (first barrier layer) extending in the Y direction. Here, the interlayer insulating layer 111 is made of, for example, oxide silicon ($SiO_2$). The conductive line 112 functions as the global bit line GBL, and is made of the material of the global bit line GBL described above. The barrier layer 113 functions as barrier metal that prevents diffusion of an impurity or the like to the conductive line 112 (third conductive line), and is made of, for example, titanium nitride (TiN).

In addition, the memory cell array 11 has an interlayer insulating layer 114 stacked in the Z direction above the barrier layer 113, and a plurality of conductive lines 115 (first conductive lines) and interlayer insulating layers 116 alternately stacked in the Z direction above the interlayer insulating layer 114. Here, a conductive layer at the lowermost layer among the conductive layers 115 is indicated by 115$b$, and a conductive layer at the uppermost layer is indicated by 115$t$. In addition, the memory cell array 11 has an interlayer insulating layer 117 stacked in the Z direction above the conductive line 115$t$ and a conductive line 118 (fourth conductive line) which is arranged to be at the same height in the Z direction as the interlayer insulating layer 117 and extends in the X direction. Here, the interlayer insulating layers 114, 116 and 117 are made of, for example, oxide silicon ($SiO_2$). The conductive line 115 extends in the X direction. This conductive line 115 functions as the word line WL, and is made of the material of the word line WL described above. Incidentally, one or more of the conductive lines 115 present at a lower layer side may function as a dummy word line. Here, a word line at the lowermost layer among the word lines WL is indicated by WLb, and a word line at the uppermost layer is indicated by WLt. The conductive line 118 functions as the gate line GL, and is made of the same material as that of the word line WL as described above.

In addition, the memory cell array 11 has a conductive line 119 (second conductive line) having a concentric rectangular shape, arranged at the intersection between the conductive lines 112 and 118 from the center thereof toward the outside, an insulating layer 120, and a semiconductor layer 121 and variable resistance films 122 arranged at both side surfaces in the Y direction of the semiconductor layer 121. The conductive line 119 is formed from an intermediate position of the interlayer insulating layer 114 in the Z direction to an intermediate position of the interlayer insulating layer 117. The insulating layer 120 is formed so as to cover a bottom surface and side surfaces of the conductive line 119, and is in contact with the bottom surface and the side surfaces of the conductive line 119. The semiconductor layer 121 is formed so as to cover a bottom surface and side surfaces of the insulating layer 120. In other words, the bottom surface of the conductive line 119 does not penetrate through each bottom surface of the insulating layer 120 and the semiconductor layer 121, and accordingly, each of the insulating layer 120 and the semiconductor layer 121 has a U-shaped cross-section in the Y-Z directions.

Here, the conductive line 119 functions as the gate electrode GE, and is made of the material of the gate electrode GE described above. The semiconductor layer 121 functions as the local bit line LBL, and is made of the material of the local bit line LBL described above. The insulating layer 120 functions as the gate insulating layer GI and is made of, for example, oxide silicon ($SiO_2$). The variable resistance film 122 functions as the variable resistance element VR, and is made of the material of the variable resistance element VR described above.

In addition, the memory cell array 11 has a barrier layer 123 arranged between the conductive lines 118 and 119, and a conductive layer 124 arranged between the barrier layer 113 and the semiconductor layer 121. The barrier layer 123 is made of, for example, titanium silicide ($TiSi_x$). The barrier layer 123 is in contact with the conductive line 119 at a bottom surface thereof, and accordingly, the conductive lines 118 and 119 are electrically connected to each other. The conductive layer 124 functions as a layer that aids an ohmic junction between the conductive line 112 and the semiconductor layer 121, and is made of, for example, n+ polysilicon (n+ Si). The conductive layer 124 is in contact with an upper surface of the barrier layer 113, and accordingly, is electrically connected to the conductive line 112.

A partial stacked structure of the memory cell array 110 is as above, and the following problem easily occurs in the case of such a structure.

In other words, the selection transistor STr of the memory cell array 110 has a structure in which a channel (the semiconductor layer 121) is formed at a periphery of the gate electrode (the conductive line 119). Hereinafter, such a structure will be referred to as a "reverse-surround gate structure" for convenience. Further, a transistor having such a reverse-surround gate structure has a difficulty in controlling a gate as compared to a typical transistor. In particular, a part r111 around a corner formed by the bottom surface and the side surfaces of the semiconductor layer 121 is separated from the conductive layer 119 which is the gate electrode GE, and further, receives a fringe electric field (white arrow a111 in FIG. 6) caused by an applied voltage with respect to the conductive layer 115b which is the word line WLb.

Figure 7:
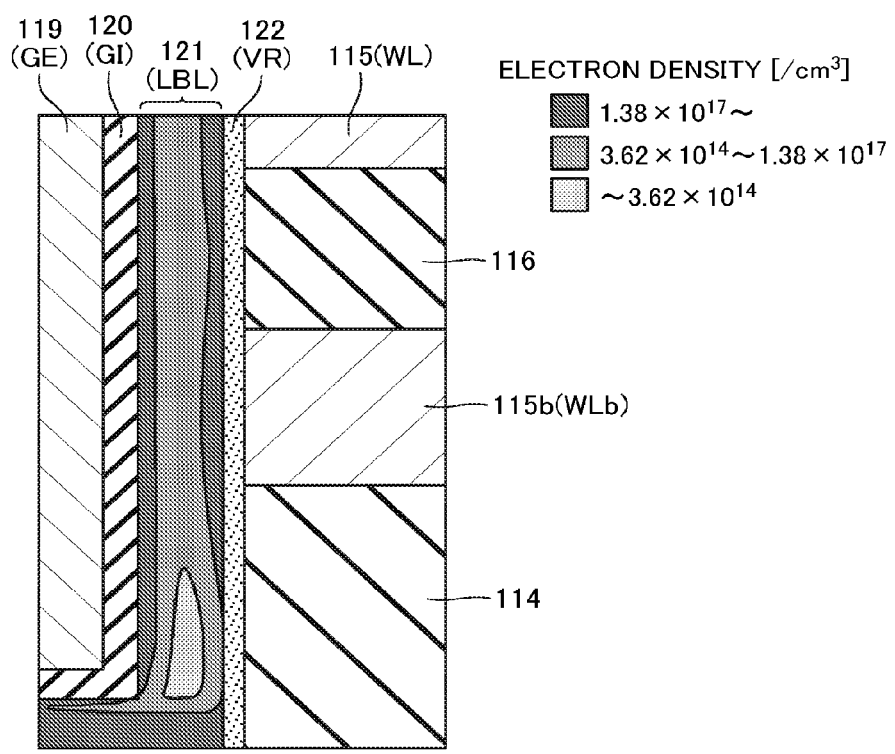
FIG. 7 is a cross-sectional view illustrating electron density distribution of a local bit line of the semiconductor memory device according to the same comparative example.
Figure 8:
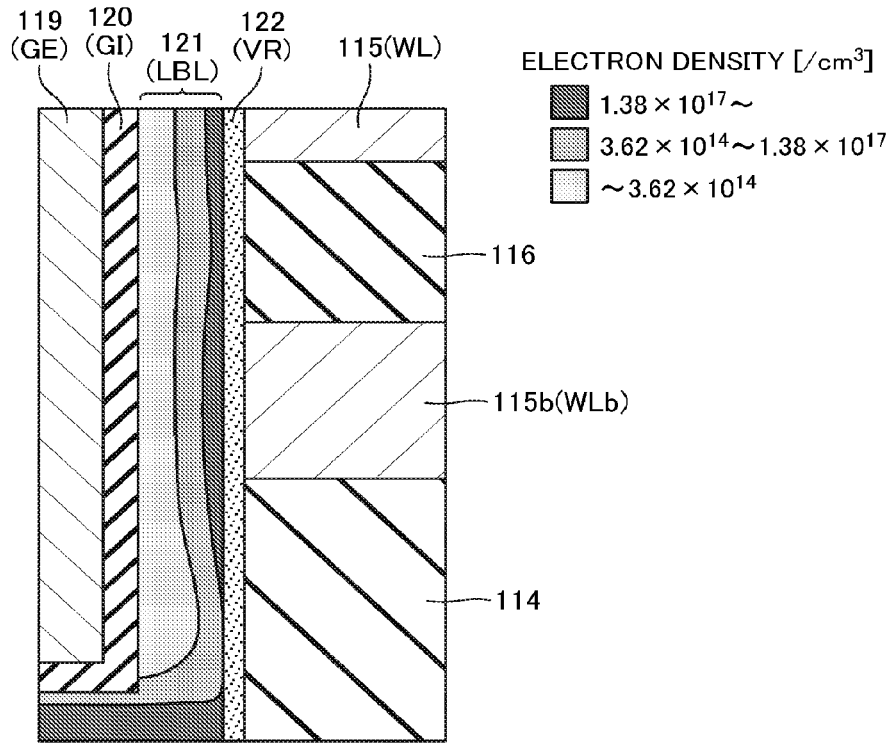
FIG. 8 is a cross-sectional view illustrating the electron density distribution of the local bit line of the semiconductor memory device according to the same comparative example.

FIGS. 7 and 8 are diagrams illustrating electron density distribution of a local bit line of the semiconductor memory device according to the first comparative example with respect to the embodiment. FIGS. 7 and 8 are cross-sectional views in the Y-Z directions obtained by enlarging a region r112 surrounded by a broken line of FIG. 6. FIG. 7 is a simulation result in a case in which the voltage Vgbl=1.0 V is applied to the global bit line GBL, the voltage Vwl=1.0 V is applied to the word line WL, and the voltage Vgl=0 V is applied to the gate line GL, and FIG. 8 is a simulation result in a case in which the voltage Vgbl=1.0 V is applied to the global bit line GBL, the voltage Vwl=1.0 V is applied to the word line WL, the voltage Vgl=−4.0 V is applied to the gate line GL.

Since a threshold voltage Vth of the channel (the semiconductor layer 121) is low even when the voltage Vgl of the gate line GL is 0 V, it is difficult to turn off the selection transistor STr sufficiently. Thus, it is understood that considerable electrons are distributed in the local bit line LBL as illustrated in FIG. 7. In this case, it is difficult to cut off a connection between the word line WL and the global bit line GBL, and it is difficult to stop an off-leakage current Ioff flowing in the local bit line LBL.

Thus, the voltage Vgl of the gate line GL is lowered to −4.0 V. In this case, it is possible to suppress the distribution of electrons in the vicinity of the side surface at the gate electrode GE side in the local bit line LBL. Even in such a case, however, there is the influence of the fringe electric field from the word line WLb as understood from FIG. 8, and thus, it is difficult to suppress the distribution of electrons in the vicinity of the side surface at the word line WL side in the local bit line LBL. In other words, even in such a case, it is difficult to sufficiently reduce the off-leakage current Ioff flowing in the local bit line LBL. Further, it is necessary to generate a negative voltage to be applied to the gate line GL in such a case, and thus, a circuit size of the power supply 15 increases.

Meanwhile, it is considered that it is possible to improve such problems when the memory cell array has the following structure.

Figure 9:
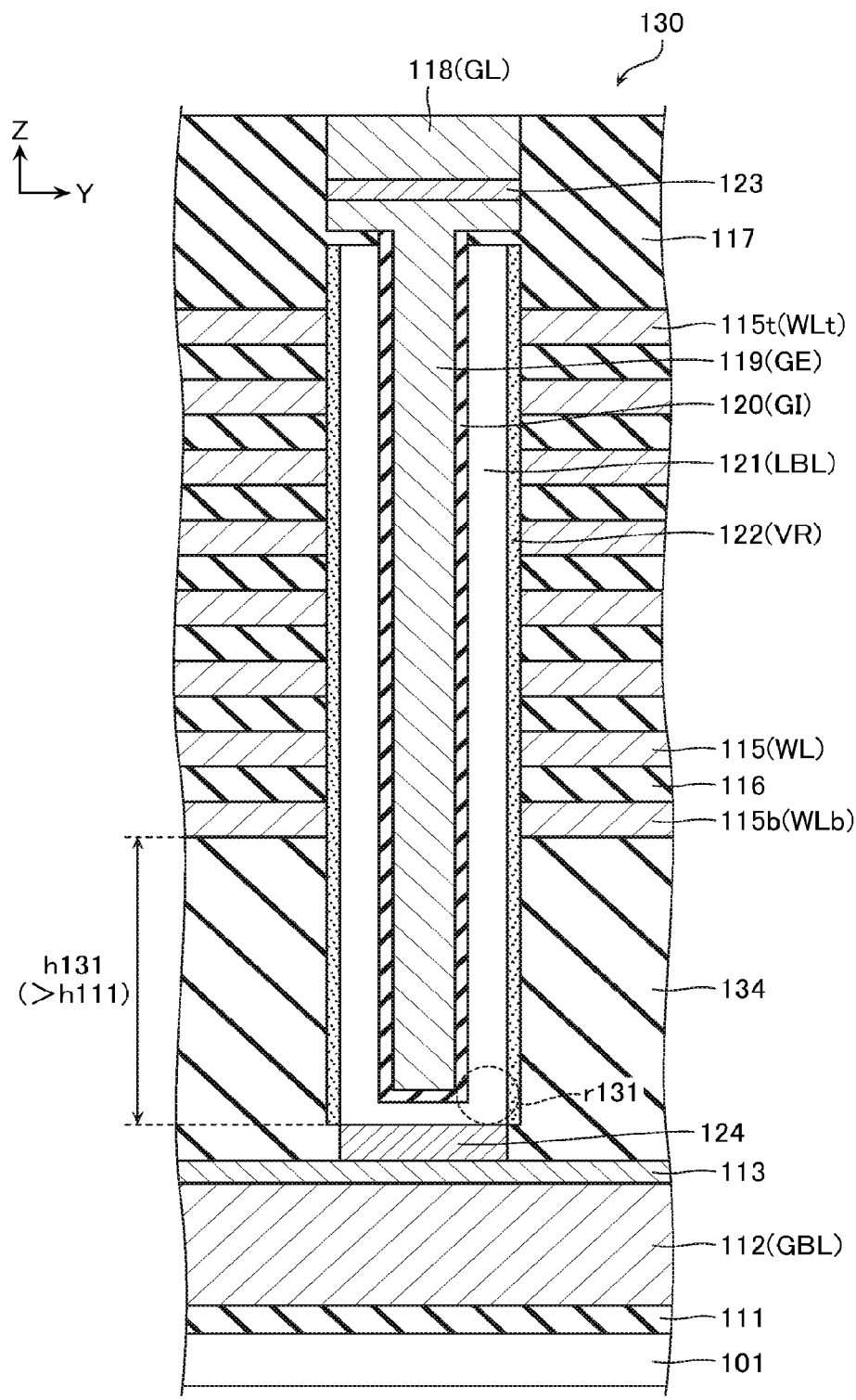
FIG. 9 is a cross-sectional view illustrating a stacked structure of a memory cell array of a semiconductor memory device according to a second comparative example with respect to the embodiment.

FIG. 9 is a cross-sectional view of a memory cell array of a semiconductor memory device according to a second comparative example with respect to the embodiment. FIG. 9 is the cross-sectional view of the Y-Z directions. In FIG. 9, the same configuration as that of FIG. 6 will be attached with the same reference numeral as that of FIG. 6, and a description thereof will be omitted.

A memory cell array 130 of the second comparative example has a structure in which an interlayer insulating layer 134 is higher in the Z direction than the interlayer insulating layer 114 of the first comparative example, and a length h131 in the Z direction from the bottom surface of the semiconductor layer 121 to the bottom surface of the conductive line 115b is longer than a length h111 of that of the memory cell array 110 of the first comparative example. Accordingly, a distance between the conductive line 115b and a part r131 around the corner formed by the bottom surface and the side surfaces of the semiconductor layer 121 increases, and thus, the influence of the fringe electric field from the conductive line 115b with respect to the part r131 is reduced. In such a structure, however, it is necessary to perform etching at a high aspect ratio when forming the conductive line 119 and the semiconductor layer 121, and there occurs a difficulty in terms of a process.

Thus, the memory cell array 11 has the following structure in the embodiment. Incidentally, the memory cell array 11 having a structure to be described herein will be referred to as a "memory cell array 150".

Figure 10:
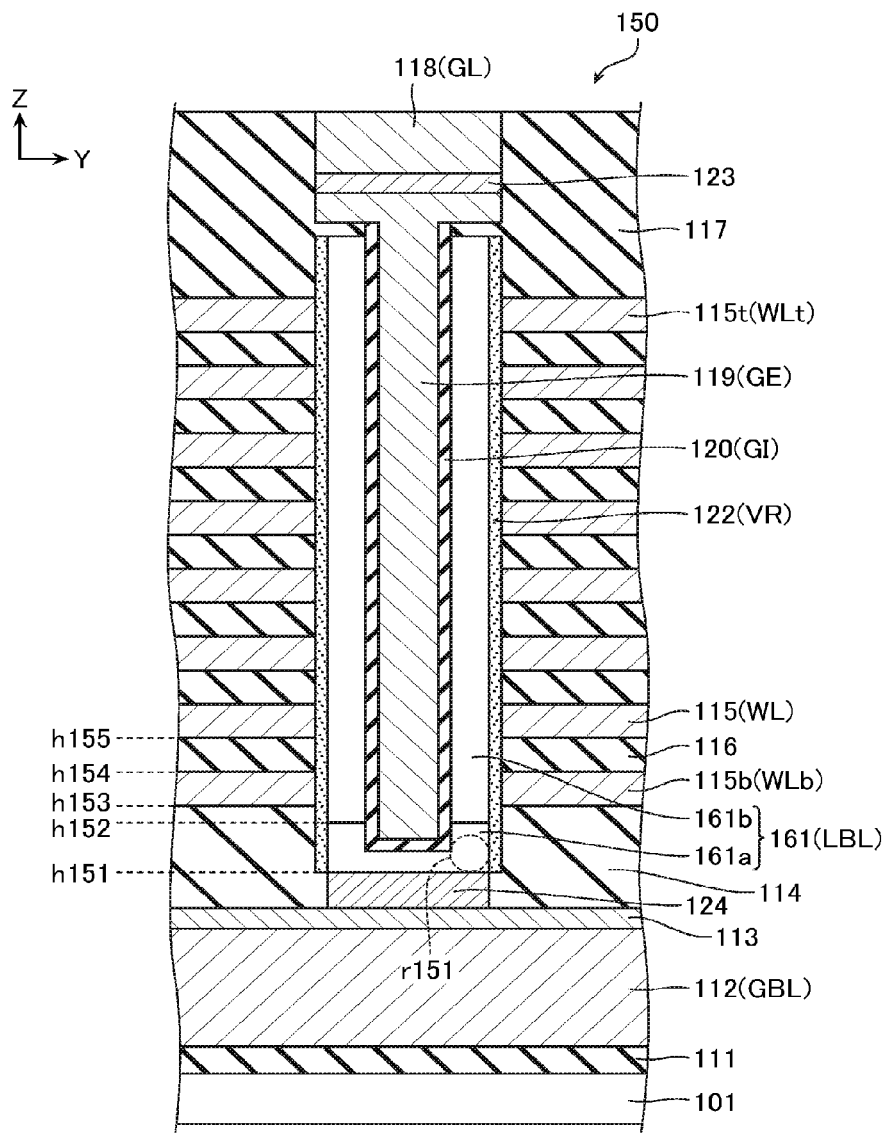
FIG. 10 is a cross-sectional view illustrating a stacked structure of the memory cell array of the semiconductor memory device according to the embodiment.

FIG. 10 is a cross-sectional view of the memory cell array of the semiconductor memory device according to the embodiment. FIG. 10 is the cross-sectional view of the Y-Z directions. In FIG. 10, the same configuration as that of FIG. 6 will be attached with the same reference numeral as that of FIG. 6, and a description thereof will be omitted.

A semiconductor layer 161 (corresponding to the semiconductor layer 121) is arranged in the memory cell array 150 of the embodiment, which is different from the memory cell array 110 of the first comparative example. The semiconductor layer 161 has a first semiconductor part 161a in the vicinity of the bottom portion which includes a part r151 around the corner formed by the bottom surface and the side surfaces, and another second semiconductor part 161b. To be specific, the semiconductor layer 161 has the first semiconductor part 161a, which is arranged from a bottom surface of the semiconductor layer 161 to a position equal to or lower than the bottom surface of the conductive layer 115b at the lowermost layer in the Z direction, and the second semiconductor part 161b which is arranged from an upper surface of the first semiconductor part 161a to a position of an upper surface of the semiconductor layer 161 in the Z direction.

The first semiconductor part 161a is a part that includes an impurity of a different conductivity type from the impurity included in the conductive layer 124. In a case in which the conductive layer 124 includes a donor (first conductivity type), for example, phosphorus (P), arsenic (As) or the like, the first semiconductor part 161a includes an acceptor (second conductivity type), for example, boron (B) or the like. Incidentally, the first semiconductor part 161a is formed by injecting the impurity such as boron (B) into a bottom portion of a hole of the semiconductor layer 161 embedded in the insulating layer 120 prior to deposition of the insulating layer 120. Here, an impurity concentration of the first semiconductor part 161a is lower than an impurity concentration of the conductive layer 124 while being higher than an the impurity concentration of the second semiconductor part 161b, and for example, is equal to or higher than $1.0 \times 10^{18}/cm^3$. In addition, the second semiconductor part 161b is made using, for example, an impurity semiconductor such as polysilicon (Poly-Si) added with an impurity such as phosphorus (P) or boron (B), arsenic (As) including an intrinsic semiconductor such as polysilicon (Poly-Si) in which the impurity is not added. Incidentally, the conductivity type of the impurity of the second semiconductor part 161b may be matched with or is not necessarily matched with the conductivity type of the impurity of the first semiconductor part 161a.

Next, a description will be given regarding an effect of the memory cell array 150 having the above-described structure.

Figure 11:
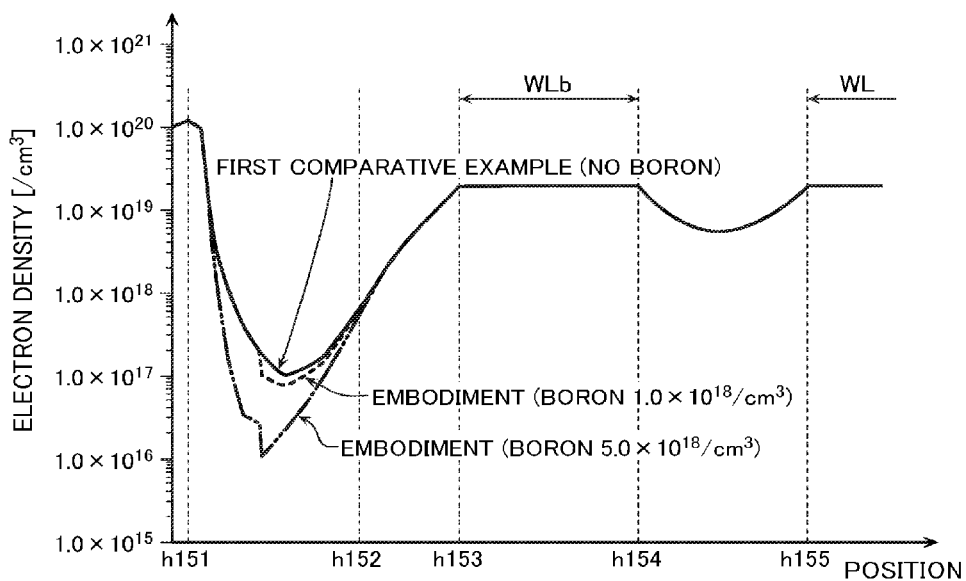
FIG. 11 is a graph illustrating a relationship of an electron density of the local bit line with respect to a position in a Z direction of the semiconductor memory device according to the embodiment.
Figure 12:
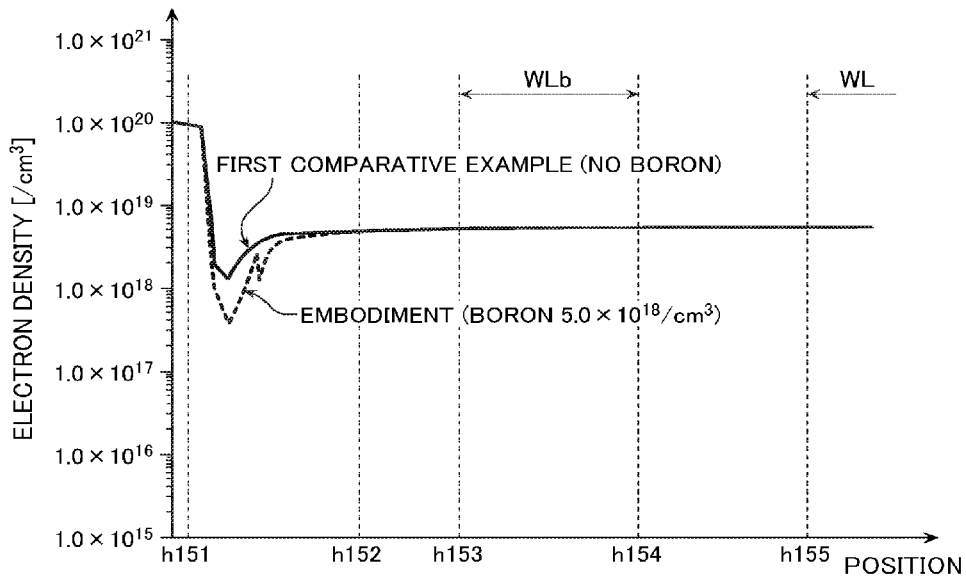
FIG. 12 is a graph illustrating the relationship of an electron density of the local bit line with respect to the position in a Z direction of the semiconductor memory device according to the embodiment.

FIGS. 11 and 12 are graphs illustrating a relationship of an electron density of the local bit line with respect to a position in the Z direction of the semiconductor memory device according to the embodiment. FIG. 11 is a simulation result in a case in which the voltage Vgbl=1.0 V is applied to the global bit line GBL, the voltage Vwl=1.0 V is applied to the word line WL, the voltage Vgl=−4.0 V is applied to the gate line GL, and FIG. 12 is a simulation result in a case in which the voltage Vgbl=1.0 V is applied to the global bit line GBL, the voltage Vwl=1.0 V is applied to the word line WL, and the voltage Vgl=0 V is applied to the gate line GL. In addition, each vertical axis of FIGS. 11 and 12 indicates an electron density of the side surface at the word line WL side of the semiconductor layer 121 (the local bit line LBL), and each horizontal axis of FIGS. 11 and 12 indicates a position (height) in the Z direction of each location of the semiconductor layer 161 illustrated in FIG. 10.

FIG. 11 illustrates the first comparative example in which boron (B) is not included in the semiconductor layer 121, an example of the embodiment in which boron (B) is added in the first semiconductor part 161a of the semiconductor layer 161 at a concentration of $1.0 \times 10^{18}/cm^3$, and an example of the embodiment in which boron (B) is added in the first semiconductor part 161a at a concentration of $5.0 \times 10^{18}/cm^3$. From FIG. 11, it is understood that the electron density of the first semiconductor part 161a positioned at heights h151 to h152 is reduced in the embodiment as compared to that in the first comparative example. In addition, such reduction of the electron density can be obtained when boron (B) is added in the first semiconductor part 161a at a concentration of equal to or higher than about $1.0 \times 10^{18}/cm^3$.

FIG. 12 illustrates the first comparative example in which boron (B) is not included in the semiconductor layer 121 and the example of the embodiment in which boron (B) is added in the first semiconductor part 161a of the semiconductor layer 161 at the concentration of $5.0 \times 10^{18}/cm^3$. From FIG. 12, it is understood that the electron density is sufficiently reduced if boron (B) is added in the first semiconductor part 161a of the semiconductor layer 161 at the concentration of $5.0 \times 10^{18}/cm^3$ even when the voltage Vsg of the gate line SG is 0 V.

As above, there is no need of extending a distance between the global bit line and the word line at the lowermost layer in the case of the embodiment as in the second comparative example by including the impurity in the bottom portion of the global bit line, and it is possible to increase the threshold voltage of the selection transistor therebetween. As a result, the selection transistor is easily turned off than in the first comparative example. In other words, according to the embodiment, it is possible to provide the semiconductor memory device of which a manufacturing process is easier than that of the second comparative example, and which is capable of further reducing the off-leakage current than that of the first comparative example.

Incidentally, it is possible to more reliably turn off the channel of the first semiconductor part 161a as the impurity concentration of the first semiconductor part 161a is higher as illustrated in FIGS. 11 to 12, but it should be noted that the channel of the first semiconductor part 161a is hardly turned on when the impurity concentration is too high on the other hand.

Figure 13:
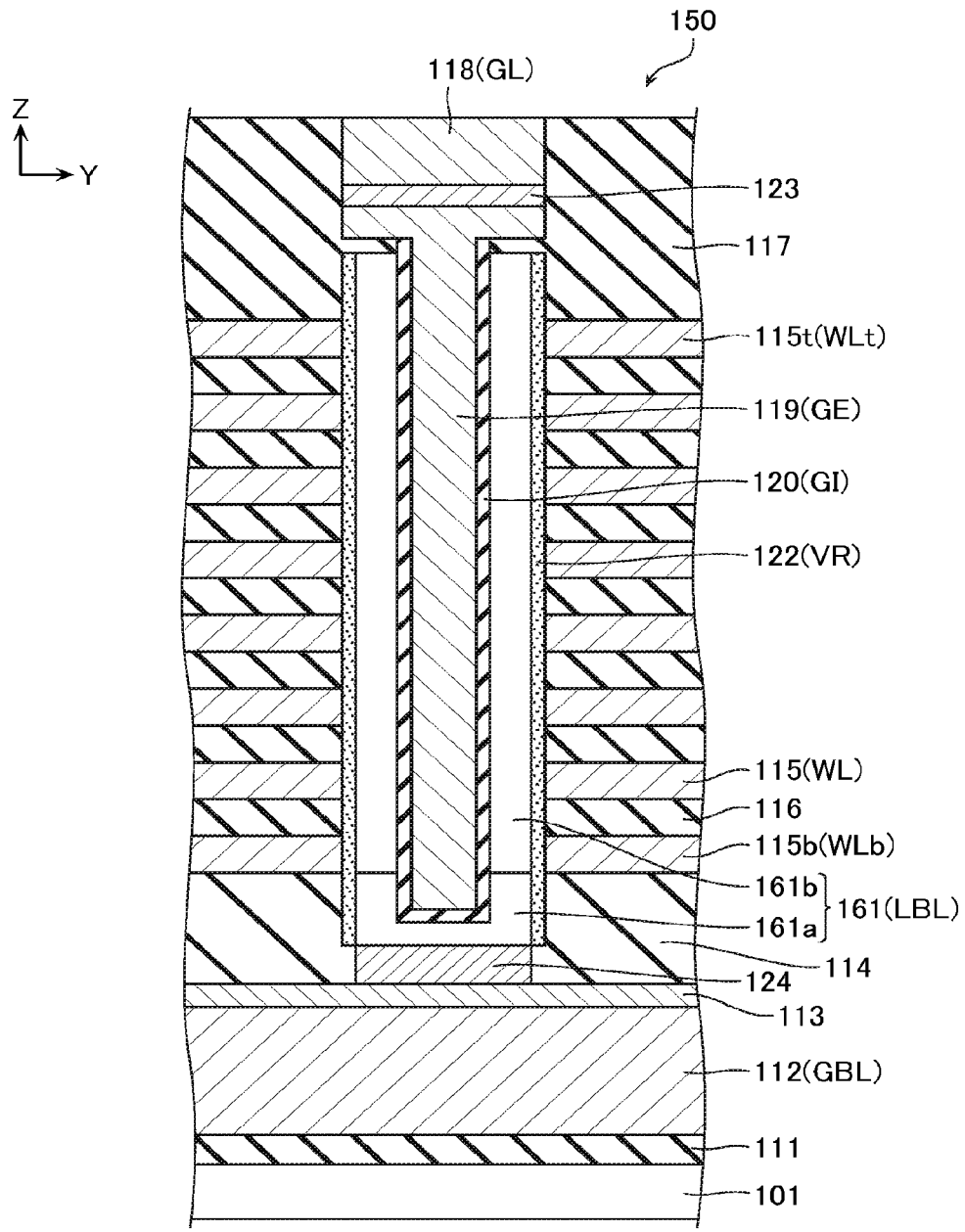
FIG. 13 is a cross-sectional view illustrating the stacked structure of the memory cell array of the semiconductor memory device according to the embodiment.

In addition, since it may be enough when the threshold voltage Vth of the selection transistor STr in the vicinity of the bottom portion of the local bit line LBL is high, the embodiment is not limited to the case of FIG. 10, and the height in the Z direction of the upper surface of the first semiconductor part 161a may be arbitrarily set in a range of not affecting selection of the memory cell MC (particularly the memory cell MC at the lowermost layer). For example, the height of the first semiconductor part 161a may be matched with a height of the bottom surface of the conductive layer 115b as illustrated in FIG. 13.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first conductive lines which are stacked in a first direction above a semiconductor substrate and extend in a second direction along to the semiconductor substrate;
a second conductive line which extends in the first direction;
a semiconductor layer which is arranged between the first conductive lines and the second conductive line and extends in the first direction;
a conductive layer which is in contact with a bottom surface of the semiconductor layer and includes a first impurity of a first conductivity type; and
a variable resistance film which is arranged between the first conductive lines and the semiconductor layer,
the semiconductor layer having a first semiconductor part which is arranged from the bottom surface of the semiconductor layer to a position equal to or lower than a bottom surface of the first conductive line at a lowermost layer in the first direction and includes a second impurity of a second conductivity type different from the first conductivity type.

2. The semiconductor memory device according to claim 1, wherein
the first impurity is a donor, and
the second impurity is an acceptor.

3. The semiconductor memory device according to claim 2, wherein
the first impurity is phosphorus (P) or arsenic (As).

4. The semiconductor memory device according to claim 2, wherein
the second impurity is boron (B).

5. The semiconductor memory device according to claim 1, wherein
the semiconductor layer has a second semiconductor part which is arranged from an upper surface of the first semiconductor part to a position of an upper surface of the semiconductor layer in the first direction, and
the second semiconductor part is formed using an intrinsic semiconductor.

6. The semiconductor memory device according to claim 1, wherein
the semiconductor layer has a second semiconductor part which is arranged from an upper surface of the first semiconductor part to a position of an upper surface of the semiconductor layer in the first direction, and the second semiconductor part includes a third impurity of the first conductivity type or the second conductivity type.

7. The semiconductor memory device according to claim 1, wherein
the first semiconductor part has a lower impurity concentration than the conductive layer.

8. The semiconductor memory device according to claim 6, wherein
the first semiconductor part has a higher impurity concentration than the second semiconductor part.

9. The semiconductor memory device according to claim 1, further comprising
a third conductive line which extends in a third direction crossing the first and second directions between the semiconductor substrate and the conductive layer in the first direction.

10. The semiconductor memory device according to claim 9, further comprising
a first barrier layer between the third conductive line and the conductive layer in the first direction,
wherein the conductive layer is electrically connected to the third conductive layer with the first barrier layer interposed therebetween.

11. The semiconductor memory device according to claim 10, wherein
the conductive layer is in contact with an upper surface of the first barrier layer.

12. The semiconductor memory device according to claim 1, further comprising
an insulating layer which is in contact with side surfaces and a bottom surface of the second conductive line.

13. The semiconductor memory device according to claim 1, further comprising
a fourth conductive line extending in the second direction and provided in the first direction above the second conductive line.

14. The semiconductor memory device according to claim 13, further comprising
a second barrier layer between the second conductive line and the fourth conductive line in the first direction,
wherein the second conductive line is electrically connected to the fourth conductive line with the second barrier layer interposed therebetween.

15. The semiconductor memory device according to claim 14, wherein
the second conductive line is in contact with a bottom surface of the second barrier layer.

16. A semiconductor memory device comprising:
a plurality of first conductive lines which are stacked in a first direction above a semiconductor substrate and extend in a second direction along to the semiconductor substrate;
a second conductive line which extends in the first direction;
a semiconductor layer which is arranged between the first conductive lines and the second conductive line and extends in the first direction; and
a variable resistance film which is arranged between the first conductive lines and the semiconductor layer,
the semiconductor layer having a first semiconductor part which is arranged from a bottom surface of the semiconductor layer to a position equal to or lower than a bottom surface of the first conductive line at a lowermost layer in the first direction and includes an acceptor.

17. The semiconductor memory device according to claim 16, wherein
the acceptor is boron (B).

18. The semiconductor memory device according to claim 16, wherein
the semiconductor layer has a second semiconductor part which is arranged from an upper surface of the first semiconductor part to an upper surface of the semiconductor layer in the first direction, and
the second semiconductor part is formed using an intrinsic semiconductor.

19. The semiconductor memory device according to claim 16, wherein
the semiconductor layer has a second semiconductor part which is arranged from an upper surface of the first semiconductor part to an upper surface of the semiconductor layer in the first direction, and
the second semiconductor part includes a donor or an acceptor.

20. The semiconductor memory device according to claim 19, wherein
the first semiconductor part has a higher impurity concentration than the second semiconductor part.

* * * * *